United States Patent
Aronowitz et al.

(10) Patent No.: US 6,897,102 B2
(45) Date of Patent: May 24, 2005

(54) PROCESS TO MINIMIZE POLYSILICON GATE DEPLETION AND DOPANT PENETRATION AND TO INCREASE CONDUCTIVITY

(75) Inventors: Sheldon Aronowitz, San Jose, CA (US); Mohammed Mirabedini, Redwood City, CA (US)

(73) Assignee: LSI Logic Corporation, Milpitas, CA (US)

( * ) Notice: Subject to any disclaimer, the term of this patent is extended or adjusted under 35 U.S.C. 154(b) by 143 days.

(21) Appl. No.: 10/313,333

(22) Filed: Dec. 6, 2002

(65) Prior Publication Data

US 2004/0110328 A1 Jun. 10, 2004

(51) Int. Cl.[7] .................. H01L 21/336; H01L 31/113
(52) U.S. Cl. ........................ 438/197; 257/288
(58) Field of Search ................. 438/773, 770, 438/769, 633, 592, 305, 257, 197, 183, 162, 153, 486, 425, 161; 257/410, 288, 64, 295; 95/45

(56) References Cited

U.S. PATENT DOCUMENTS 6,132,492 A * 10/2000 Hultquist et al. ............ 95/45

* cited by examiner

Primary Examiner—David Zarneke
Assistant Examiner—Monica D. Harrison
(74) Attorney, Agent, or Firm—Trexler, Bushnell, Giangiorgi, Blackstone & Marr, Ltd.

(57) ABSTRACT

A method of preparing a polysilicon gate to minimize gate depletion and dopant penetration and to increase conductivity is revealed. Several monolayers of atomic are condensed onto a gate dielectric. Polysilicon is deposited onto the calcium and patterned in a standard way. The exposed calcium is then removed by raising the temperature to approximately 600° C. The calcium remaining between the gate dielectric and the polysilicon blocks channeling of dopant to minimize depletion and penetration, increase conductivity, and allow for longer and higher-temperature annealing.

26 Claims, 1 Drawing Sheet

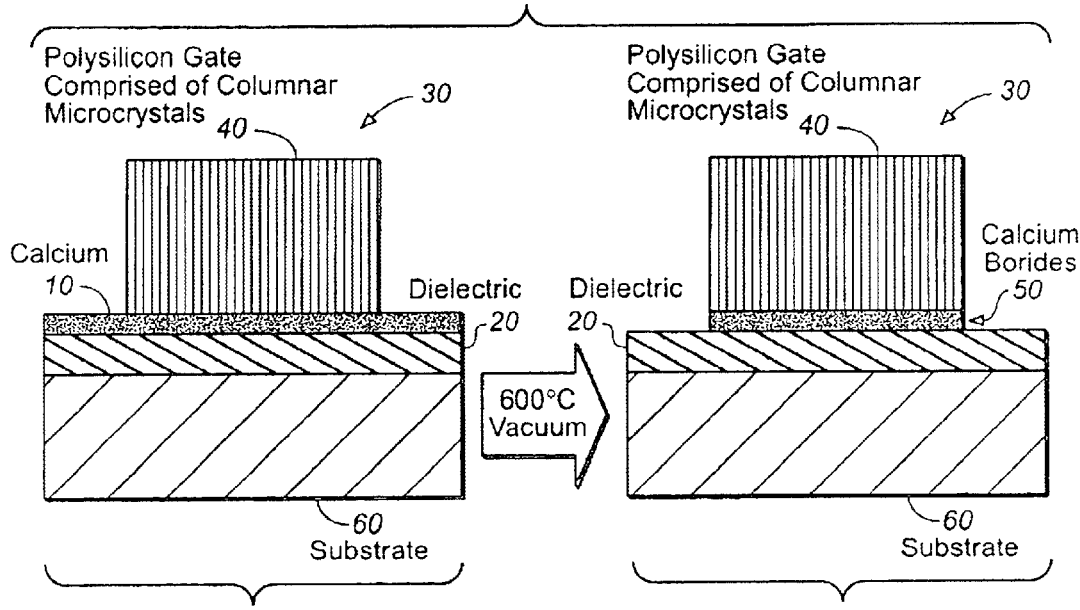

PROCESS TO MINIMIZE POLYSILICON GATE DEPLETION AND DOPANT PENETRATION AND TO INCREASE CONDUCTIVITY

BACKGROUND OF THE INVENTION

The present invention relates to the field of semiconductors, and in particular the use of polysilicon gates.

As the geometries of semiconductor devices have decreased, the thickness of the gate dielectric has similarly decreased. Accordingly, problems arising with the use of ever-thinner gate dielectrics have become more pressing. One problem is that as the gate dielectric is thinned, the boron dose for p-channel devices has to be reduced to avoid, for example, massive boron penetration through the gate dielectric. Another problem with device scaling is that the poly depletion effect becomes significant when the depletion layer thickness is compared to the thin gate dielectric thickness. In addition, for polysilicon gates grains form columnar structures that enhance both penetration and deactivation of boron. Similar considerations apply to phosphorus-doped polysilicon gates.

Additionally, the anneal temperature has to be reduced for thin polysilicon gates, also to avoid massive boron penetration into the gate dielectric. Annealing at a lower temperature reduces activation. Moreover, source/drain junctions are another consideration.

As long as it is desired to use polysilicon for gate material, a process that would allow very thin gates while minimizing depletion and penetration effects is desirable. At the same time, a process that increases conductivity of the gate electrode is always desirable. Accordingly, a need exists for a process to minimize gate depletion and dopant penetration, and to increase conductivity, while allowing for higher anneal temperatures to increase activation.

OBJECTS AND SUMMARY

The present invention involves preparing a polysilicon gate by condensing calcium onto a gate dielectric, depositing polysilicon onto the gate dielectric, and patterning the polysilicon, It is an object of the present invention to provide a method of preparing polysilicon gates that minimizes depletion and penetration effects.

It is a further object of the present invention to provide a method of preparing polysilicon gates that increases conductivity of the gate electrode.

It is a further object of the present invention to provide a method of preparing polysilicon gates that allows for higher anneal temperatures in order to increase activation.

BRIEF DESCRIPTION OF THE DRAWINGS

The organization and manner of the structure and operation of the invention, together with further objects and advantages thereof, may best be understood by reference to the following description, taken in connection with the accompanying drawing, wherein FIG. 1 is an illustration of a gate dielectric after the deposition of calcium and the deposition and patterning of the silicon gate. FIG. 1a illustrates the appearance of the gate before the application of the method of the present invention. FIG. 1b illustrates the appearance of the gate after the application of the method of the present invention.

FIG. 2 is a flow chart of one embodiment of the method of the present invention.

DESCRIPTION OF THE INVENTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

The invention is particularly suitable for gate dielectrics that are oxygen-rich. These dielectric materials include $SiO_2$, $HfO_2$, and $HfSiO_4$. In principle, however, use of the invention is not limited to oxygen-rich dielectrics.

The method is illustrated in FIG. 1 and outlined in flow chart form in FIG. 2. The method starts after application of the gate dielectric 20 to the substrate 60 of the wafer 30. The method begins by condensing several monolayers of calcium 10 on the gate dielectric 20 from the gas phase. The vapor pressure of atomic calcium in the solid phase is approximately 10 mTorr at 600° C. A carrier gas, such as argon, conveying 0.5 cc/sec of this calcium vapor at this temperature, will deposit a monolayer of calcium 10 on the gate dielectric 20 approximately every 10 seconds. The temperature of the wafer 30 should be maintained at a lower temperature. If the surface temperature of the wafer was maintained at, for example, 200° C., the vapor pressure of the deposited calcium 10 would be approximately $1 \times 10^{-8}$ mTorr; this vapor pressure would be sufficiently low to ensure that the calcium would remain on the surface.

Next, polysilicon is deposited and patterned in the usual way to form the polysilicon gate 40. As the invention is directed at the use of thin gates, the polysilicon gate 40 will form columnar microcrystals.

After the polysilicon has been patterned, the deposited calcium monolayer 10 can either be removed by a wet etch (such as with hydrochloric acid) or removed by raising the temperature to around 600° C. under vacuum conditions, causing the exposed calcium 10 to vaporize. The first layer of calcium 10 might react with underlying oxygen; this calcium oxide could be preferentially removed with a wet etch but the normal etch procedure to remove exposed $SiO_2$ will remove this chemisorbed calcium.

The p-channel device region is then implanted in the usual way with boron for source/drain and gate, followed by an anneal. The calcium 10 will effectively block all penetration by reacting with boron at the grain boundaries to form borides 50. The anneal time can be lengthened without increasing boron penetration, for example.

The n-channel device regions is also implanted in the usual way with phosphorus for the polysilicon gate and arsenic for the source/drain, followed by an anneal. The calcium 10 will effectively block all penetration by reacting with phosphorus at the grain boundaries to form phosphides. The anneal time of an n-channel device then can also be lengthened without increasing phosphorus penetration. Blocking dopant penetration into the gate dielectric from either n-doped or p-doped polysilicon gates eliminates the need for any special anneal sequencing with respect to activating the dopants in the polysilicon.

FIG. 1 illustrates one embodiment of the method of the present invention. FIG. 1a shows a silicon wafer 30 with a gate dielectric 20 deposited on the substrate 60, after the calcium 10 has been deposited and the polysilicon 40 deposited and patterned. If the barrier was not effective, dopant penetration into the dielectric 20 would be almost catastrophic. Heating the wafer 30 to 600° C. under vacuum conditions, however, will vaporize unreacted calcium and initiate reactions between calcium and boron to form borides 50. FIG. 1b illustrates the wafer 30 after application of this method. The exposed calcium 10 on the gate dielectric 20 has evaporated, leaving a barrier between the gate dielectric 20 and the polysilicon 40 composed of calcium borides 50.

Alternatively, higher temperatures may be used. Increasing the temperature by 80 degrees will increase the calcium vapor pressure by an order of magnitude. However, the borides and phosphides are stable compounds with high temperature melting points and very low vapor pressures. Accordingly, a higher annealing temperature can be tolerated.

While preferred embodiments of the present invention are shown and described, it is envisioned that those skilled in the art may devise various modifications of the present invention without departing from the spirit and scope of the appended claims.

We claim:

1. A method of preparing a polysilicon gate to minimize polysilicon gate depletion and dopant penetration, and to increase conductivity, comprising condensing at least one monolayer of atomic calcium from the gas phase onto a gate dielectric, depositing polysilicon onto said at least one monolayer of calcium, patterning said polysilicon, raising the temperature of said polysilicon, applying a vacuum, and implanting a dopant into said polysilicon.

2. The method according to claim 1, wherein said polysilicon is maintained at a substantially lower temperature than the temperature of said atomic calcium in the gas phase.

3. The method according to claim 1, wherein said gate dielectric comprises an oxygen-rich material.

4. The method according to claim 1, wherein said gate dielectric comprises a material chosen from the following group: silicon dioxide, hafnium dioxide, and hafnium silicon dioxide.

5. The method according to claim 1, wherein said dopant is boron.

6. The method according to claim 1, wherein said dopant is phosphorus.

7. The method according to claim 1, wherein said condensing step comprises condensing a plurality of layers of atomic calcium from the gas phase onto a gate dielectric.

8. A polysilicon gate with minimal gate depletion and dopant penetration and increased conductivity, comprising a gate dielectric, at least one monolayer of atomic calcium condensed onto said gate dielectric, and doped polysilicon deposited onto said calcium.

9. The polysilicon gate of claim 8, wherein said gate dielectric comprises an oxygen-rich material.

10. The polysilicon gate of claim 8, wherein said gate dielectric comprises a material chosen from the following group: silicon dioxide, hafnium dioxide, and hafnium silicon dioxide.

11. The polysilicon gate of claim 8, wherein said polysilicon is doped with boron.

12. The polysilicon gate of claim 8, wherein said polysilicon is doped with phosphorus.

13. The polysilicon gate of claim 8, wherein said at least one monolayer of atomic calcium comprises a plurality of monolayers of calcium.

14. A method of preparing a polysilicon gate to minimize polysilicon gate depletion and dopant penetration, and to increase conductivity, comprising depositing at least one monolayer of atomic calcium from the gas phase onto a gate dielectric, depositing polysilicon onto said at least one monolayer of calcium, patterning said polysilicon, raising the temperature of said polysilicon, applying a vacuum, and implanting a dopant into said polysilicon.

15. The method according to claim 14, wherein said polysilicon is maintained at a substantially lower temperature than the temperature of said atomic calcium in the gas phase.

16. The method according to claim 14, wherein said gate dielectric comprises an oxygen-rich material.

17. The method according to claim 14, wherein said gate dielectric comprises a material chosen from the following group: silicon dioxide, hafnium dioxide, and hafnium silicon dioxide.

18. The method according to claim 14, wherein said dopant is boron.

19. The method according to claim 14, wherein said dopant is phosphorus.

20. The method according to claim 14, wherein said condensing step comprises condensing a plurality of layers of atomic calcium from the gas phase onto a gate dielectric.

21. A polysilicon gate with minimal gate depletion and dopant penetration and increased conductivity, comprising a gate dielectric, at least one monolayer of atomic calcium deposited onto said gate dielectric, and doped polysilicon deposited onto said calcium.

22. The polysilicon gate of claim 21, wherein said gate dielectric comprises an oxygen-rich material.

23. The polysilicon gate of claim 21, wherein said gate dielectric comprises a material chosen from the following group: silicon dioxide, hafnium dioxide, and hafnium silicon dioxide.

24. The polysilicon gate of claim 21, wherein said polysilicon is doped with boron.

25. The polysilicon gate of claim 21, wherein said polysilicon is doped with phosphorus.

26. The polysilicon gate of claim 21, wherein said at least one monolayer of atomic calcium comprises a plurality of monolayers of calcium.

* * * * *

UNITED STATES PATENT AND TRADEMARK OFFICE
CERTIFICATE OF CORRECTION

PATENT NO. : 6,897,102 B2
DATED : May 24, 2005
INVENTOR(S) : Sheldon Aronowitz et al.

It is certified that error appears in the above-identified patent and that said Letters Patent is hereby corrected as shown below:

<u>Title page,</u>
Item [75], Inventors, change "Mohammed" to -- Mohammad --.

Signed and Sealed this

Ninth Day of August, 2005

JON W. DUDAS
*Director of the United States Patent and Trademark Office*